(12) United States Patent
Frischke

(10) Patent No.: US 9,639,653 B2
(45) Date of Patent: May 2, 2017

(54) METHOD FOR CHECKING A HARDWARE-CONFIGURABLE LOGIC CIRCUIT FOR FAULTS

(71) Applicant: Robert Bosch GmbH, Stuttgart (DE)

(72) Inventor: Michael Frischke, Hemmingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/562,124

(22) Filed: Dec. 5, 2014

(65) Prior Publication Data
US 2015/0161323 A1 Jun. 11, 2015

(30) Foreign Application Priority Data
Dec. 6, 2013 (DE) .......... 10 2013 225 131

(51) Int. Cl.
| | | |
|---|---|---|
| G06F 17/50 | (2006.01) | |
| G06F 11/00 | (2006.01) | |
| G01R 31/3185 | (2006.01) | |
| G11C 29/04 | (2006.01) | |

(52) U.S. Cl.
CPC .......... *G06F 17/5081* (2013.01); *G06F 11/00* (2013.01); *G06F 17/5054* (2013.01); *G01R 31/318516* (2013.01); *G01R 31/318519* (2013.01); *G06F 17/5027* (2013.01); *G06F 2217/14* (2013.01); *G11C 2029/0411* (2013.01)

(58) Field of Classification Search
CPC ............ G06F 17/5027; G06F 17/5054; G01R 31/318516; G01R 31/318519
USPC .................. 716/117, 136; 714/725
See application file for complete search history.

(56) References Cited

U.S. PATENT DOCUMENTS

| | | | | | |
|---|---|---|---|---|---|
| 7,577,055 | B2 * | 8/2009 | Ngo | ............... | H03K 19/17764 365/189.05 |
| 7,590,904 | B2 * | 9/2009 | Ng | ............... | G01R 31/318519 326/37 |
| 7,620,853 | B1 * | 11/2009 | Kasnavi | ............... | G11C 29/025 714/42 |
| 8,112,678 | B1 * | 2/2012 | Lewis | ............... | G06F 11/106 714/48 |
| 8,130,574 | B2 * | 3/2012 | Ngo | ............... | H03K 19/17764 365/189.07 |
| 8,166,366 | B1 * | 4/2012 | Trimberger | ............ | G06F 11/10 714/725 |
| 8,572,538 | B2 * | 10/2013 | Mendel | ........... | H03K 19/17756 326/38 |
| 8,935,645 | B2 * | 1/2015 | Mendel | ........... | H03K 19/17756 6/106 |
| 9,405,612 | B2 * | 8/2016 | Kobayashi | ......... | G06F 11/0793 |

(Continued)

*Primary Examiner* — Stacy Whitmore
(74) *Attorney, Agent, or Firm* — Gerard Messina

(57) ABSTRACT

A method is described for checking a hardware-configurable logic circuit including circuit areas and including a configuration memory having different subareas for faults, a respective configuration of hardware elements of one of the circuit areas being defined by configuration data stored in an associated subarea of the configuration memory, and when at least one checking requirement in regard to an output signal which is provided by the hardware-configurable logic circuit is met, a fault check of the configuration data being carried out only in those subareas of the configuration memory of the hardware-configurable logic circuit which are involved in generating the output signal.

12 Claims, 2 Drawing Sheets

(56) References Cited

U.S. PATENT DOCUMENTS

| | | | |
|---|---|---|---|
| 2004/0153923 A1* | 8/2004 | Goel | G06F 11/1402 714/724 |
| 2006/0190903 A1* | 8/2006 | Koo | G06F 11/20 713/100 |
| 2008/0215935 A1* | 9/2008 | Goel | G06F 11/1402 714/708 |
| 2008/0278195 A1* | 11/2008 | Goodnow | G06F 17/5027 326/38 |
| 2013/0007679 A1* | 1/2013 | Mendel | H03K 19/17756 6/106 |
| 2014/0047401 A1* | 2/2014 | Mendel | H03K 19/17756 716/106 |

\* cited by examiner

METHOD FOR CHECKING A HARDWARE-CONFIGURABLE LOGIC CIRCUIT FOR FAULTS

FIELD OF THE INVENTION

The present invention relates to a method for checking a hardware-configurable logic circuit for faults.

BACKGROUND INFORMATION

Usual conventional hardware is not changeable during the run time. However, different functionalities of conventional hardware may be achieved by executing different software. Contrary to this, hardware made of hardware-configurable logic circuits is not unalterable, but may be changed at any time. Hardware-configurable logic circuits may be reprogrammed or reconfigured at the hardware level with the aid of a hardware description language (HDL). Different functionalities may thus be assigned to the hardware-configurable logic circuits. Hardware-configurable logic circuits may be so-called field-programmable gate arrays (FPGAs), for example.

To reconfigure FPGAs, individual circuit areas of an FPGA may be interconnected differently. A configuration of hardware elements in the individual circuit areas is changed for this purpose. With the aid of these different configurations, a different function or functionality of the circuit areas, and thus of the FPGA, is achieved. Such hardware elements may be, for example, lookup tables (LUT), multiplexers (Mux), interconnections between logic instances (e.g., programmable interconnect points) and/or global resources (Clock, Vcc, GND).

Information about different hardware configurations (configuration data) may be stored in a so-called configuration memory. The hardware elements within individual circuit areas and the circuit areas among each other are interconnected with each other according to these configuration data in the configuration memory. In particular certain subareas of the configuration memory may contain configuration data for different circuit areas of the FPGA.

To satisfy safety-critical requirements, faults of a hardware-configurable logic circuit must be detected and treated preferably quickly. Such a fault occurs, for example, when individual circuit areas of the hardware-configurable logic circuit are incorrectly interconnected with each other. Accordingly, an output signal which is provided by the hardware-configurable logic circuit is faulty. For the automotive field, safety-critical requirements are defined in an ISO standard. According to this standard, a fault must be detected and treated within a so-called fault tolerant time. The fault tolerant time describes the time between the occurrence of a fault and a hazardous event. A time duration between the occurrence and detection of the fault is described as the fault detection time.

To check a hardware-configurable logic circuit for faults, it is possible, for example, to cyclically check all subareas of the configuration memory. It is thus checked whether the correct configuration data for all circuit areas of the hardware-configurable logic circuit are stored in all subareas. However, this may take up a comparatively long time duration of 10 ms or more. This, in turn, may result in a high fault detection time. To be able to adhere to the fault tolerant time with certainty, however, it is desirable to keep the fault detection time as short as possible.

It is therefore desirable to provide an option of carrying out a fault check of a hardware-configurable logic circuit quickly and reliably.

SUMMARY

According to the present invention, a method for checking a hardware-configurable logic circuit for faults is provided.

Hardware-configurable logic circuits shall be understood to mean reconfigurable memory units, reconfigurable data processing units or reconfigurable hardware which include changeable, configurable hardware. The hardware may be reconfigured with the aid of hardware configurations generated in particular with the aid of a hardware description language (HDL). The hardware-configurable logic circuit may be divided into advantageous circuit areas. Within these individual circuit areas, a configuration of advantageous hardware elements or resources may be changed in each case. A function of the individual circuit areas may thus be changed. Such hardware elements or resources are, for example, lookup tables (LUT), multiplexers (Mux), interconnections between logic instances (e.g., programmable interconnect points), interconnect connecting points and/or global resources (e.g., Clock, Vcc, GND, operating voltage). The individual circuit areas themselves may also be differently interconnected with each other. The method according to the present invention is particularly advantageously suitable for field programmable gate arrays (FPGAs).

The hardware-configurable logic circuit moreover includes a configuration memory. Configuration data are stored or saved in the configuration memory, which define how the hardware-configurable logic circuit or its different circuit areas are configured. The configuration memory is in particular divided into advantageous subareas, for example into advantageous frames. Each subarea is in particular linked to a certain circuit area. It is stored or saved in the individual subareas how the particular circuit areas are configured.

The method according to the present invention is suitable for any arithmetic units in which hardware-configurable logic circuits according to the present invention are used. The method according to the present invention is in particular suitable for control units, for example of motor vehicles, systems, or in the aerospace industry.

According to the present invention, a fault check of the configuration data is not carried out in all subareas of the configuration memory. To carry out a fault check of the hardware-configurable logic circuit, or to carry out a fault check of an output signal provided by the hardware-configurable logic circuit, according to the present invention only those subareas which are used to generate the output signal are checked for faults. These subareas to be checked are linked to those circuit areas which are involved in generating the output signal.

It is thus not necessary according to the present invention to also check those subareas which are not involved at all in providing the output signal, or those subareas which are linked to circuit areas which are not involved at all in providing the output signal. In this way, a fault check according to the present invention may be carried out much more quickly than a conventional (cyclical) fault check of all subareas of the configuration memory of the hardware-configurable logic circuit.

It is thus possible to ensure that faults in the hardware-configurable logic circuit are detected preferably quickly and that a fault detection time is preferably kept to a minimum. It is thus moreover ensured that a detected fault may be treated preferably quickly and corresponding counter measures may be initiated. One such counter measure may be, for example, that the output signal is declared to be faulty. After a fault occurs, the hardware-configurable logic circuit may thus be transferred into a safe state preferably quickly. The present invention thus ensures that a predefined fault tolerant time may be adhered to.

The present invention in particular ensures that safety requirements or safety-critical requirements according to the ISO standard 26262, for example, are met or adhered to, in particular when the hardware-configurable logic circuit is used in a motor vehicle or in the automotive field. In this way, safety for occupants of the motor vehicle and fault-free operation of the motor vehicle may be ensured.

To generate the output signal, data are processed within the appropriate circuit areas and exchanged between the appropriate circuit areas. In the course of generating or providing the output signal, a data flow is thus generated between certain circuit areas of the hardware-configurable logic circuit. To provide the output signal, data are processed or exchanged or forwarded by the appropriate circuit areas along certain data paths. The individual subareas of the configuration memory to be checked are responsible that these appropriate circuit areas are correctly configured. These individual subareas of the configuration memory are thus involved in generating or providing the output signal.

The present invention thus represents a data flow-oriented fault check or data flow-oriented fault detection. The data paths for providing the output signal by the circuit areas of the hardware-configurable logic circuit are thus linked to the fault check of the appropriate subareas of the configuration memory according to which the circuit areas are configured. It is thus checked whether it is stored or saved correctly in the individual subareas of the configuration memory how the appropriate subareas of the hardware-configurable logic circuit are to be configured.

The fault check is carried out when at least one checking requirement in regard to the output signal is met. The fault check is triggered in particular with the aid of a trigger. Such a checking requirement or such a trigger may be met as soon as the hardware-configurable logic circuit provides the output signal. For example, the hardware-configurable logic circuit may signal that the data flow through the individual circuit areas is completed and the output signal is being provided. It may thus be ensured that a fault check is carried out directly after the output signal is provided.

The checking requirement or the trigger may furthermore in particular be met as soon as data are transmitted from one circuit area to another circuit area in the course of the data flow or along the data path for generating the output signal. The fault check of the individual subareas may already be carried out preferably quickly while the output signal is being generated.

In particular, one address list is stored in each case for each output signal in the hardware-configurable logic circuit. These address lists indicate the particular circuit areas which influence the particular output signal or which are involved in generating the particular output signal. Analogously, the address lists also indicate the particular subareas of the configuration memory which influence the particular output signal or which are involved in generating the particular output signal. The address lists in particular contain memory addresses of the particular subareas. These address lists thus represent a checklist indicating which subareas of the configuration memory are to be checked for faults upon the provision of which output signal. For example, the address lists may be created during the ongoing operation of the hardware-configurable logic circuit as soon as an output signal is provided. As an alternative, the address lists may also be created in the course of a production process or programming process of the hardware-configurable logic circuit and stored in the hardware-configurable logic circuit.

In the course of the fault check it is advantageously checked whether the output data were generated according to a correct netlist. A netlist describes electrical connections between the individual hardware elements. The netlist thus represents a circuit diagram of the individual circuit areas of the hardware-configurable logic circuit. In particular, the configuration of the circuit areas is changed according to such a netlist. In particular, appropriate netlists are stored in the individual subareas, according to which the appropriate circuit areas of the hardware-configurable logic circuit are configured. In particular, certain netlists are stored in each case for certain output signals in the subareas of the configuration memory. These netlists describe how the individual circuit areas of the hardware-configurable logic circuit must be configured to generate a corresponding output signal.

In the course of the fault check, it is thus checked whether the appropriate netlists for the particular circuit areas are correctly stored in the individual subareas. On the other hand, it is thus possible to check whether all circuit areas which are involved in generating the output signal were correctly configured according to the predefined netlist.

The fault check is preferably carried out with the aid of an error correcting code and/or a check sum. In the course of the fault check, in particular an advantageous "single error correction double error correction method" is carried out, for example, an error correcting code (ECC) process. For example, an additional redundancy (for example in the form of additional bits) may be added to the configuration data prior to the data transmission into the appropriate subareas. These additional bits may be used to determine faults. For example, the appropriate configuration data to be checked may be provided with an ECC check sum in the subareas of the configuration memory. A theoretical or expected value of the ECC check sum is stored in particular in the configuration memory. This theoretical ECC check sum is compared to a calculated ECC check sum of the individual configuration data to be checked.

The checking requirement is preferably met, and the fault check is carried out, when a level change of the output signal occurs. Such a level change is in particular a direct event which triggers the fault check. A further preferred checking requirement is met when a periodic requirement in regard to the output signal is met. Such a periodic requirement is independent of level changes of the output signal. The fault check is carried out in particular at constant (temporal) intervals. A further preferred checking requirement is met when dependent level changes occur. Such dependent level changes are level changes of different signals, for example of the output signal and of an enable signal.

In general, in particular changes in the output signal may trigger the fault check. Changes in the output signal may indicate a violation of a safety requirement or a fault. Changes in the output signal in particular indicate a fault according to ISO standard 26262.

In one advantageous embodiment of the present invention, the fault check of the individual subareas of the configuration memory which are involved in generating the output signal is carried out according to a certain order. This order is thus a schedule according to which the individual subareas are subjected to the fault check. In particular, a time interval which is available for the fault check is divided into individual time periods. For example, these time periods are identically selected at one microsecond each. A fault check of a subarea is carried out in the particular time periods. Each time period is thus assigned according to the certain order of the fault check of a certain subarea.

The order is advantageously determined during regular operation or during the run time of the hardware-configurable logic circuit. As soon as the output signal is provided during ongoing operation of the hardware-configurable logic circuit, or as soon as a checking requirement is met, the order in which the subareas are checked is determined. Such a determination of the order is referred to as "online scheduling." This online scheduling lends itself in particular for non-deterministic behavior of the hardware-configurable logic circuit. It is in particular not possible to predict when an output signal will be provided and when the circuit areas linked to the individual subareas will process data for the output signal.

As an alternative, the order is advantageously determined during a programming process of the hardware-configurable logic circuit. During the programming process or a production process or a development phase, it is already established in which order the individual subareas will be checked during later regular operation of the hardware-configurable logic circuit. Such a determination of the order is referred to as "offline scheduling." This offline scheduling lends itself in particular for deterministic behavior of the hardware-configurable logic circuit. It is in particular possible to predict when an output signal will be provided and when individual circuit areas linked to the subareas will process data for the output signal.

The order is preferably determined as a function of priorities of the individual subareas. It may be necessary to carry out a prioritization, in particular when multiple output signals are provided by the hardware-configurable logic circuit and a plurality of subareas is to be checked for faults. Even when multiple checking requirements are met (approximately simultaneously), this may result in a plurality of subareas having to be checked for faults. It may also be necessary in this case to carry out a prioritization. In the course of this prioritization, it is determined which subareas are to be checked for faults with which priority or relevance or urgency. The order of the fault check of the individual subareas is determined according to this prioritization.

Preferably a deadline is assigned in each case to the subareas to be checked to prioritize the fault check of the individual subareas. The fault check of the individual subareas must be carried out in each case by this particular deadline. The order is determined in particular with the aid of the so-called earliest deadline first (EDF) method. Subareas having a short deadline are treated in a prioritized fashion and subjected to a fault check first. In particular, a fault check is carried out in each case of that subarea which has the shortest deadline.

An arithmetic unit according to the present invention, e.g., a control unit of a motor vehicle, is configured, in particular from a programming point of view, to carry out a method according to the present invention.

The arithmetic unit according to the present invention may be designed, for example, as an ECC (error correcting code) controller or as a DCC ECC (dataflow controlled configuration ECC) controller. Such an ECC controller, or such a DCC ECC controller, carries out in particular an error correcting code (ECC) process as the fault check. The ECC controller or the DCC ECC controller in particular has access to an evaluation unit. This evaluation unit is in particular configured to compare the calculated ECC check sum of the subareas which are to be checked to the stored theoretical ECC check sum.

This controller is in particular configured to determine the order according to which the individual subareas are checked for faults. The controller is accordingly configured to carry out an online scheduling. The controller may in particular read in an appropriate address list from the hardware-configurable logic circuit and thus read in the addresses of the subareas to be checked. Moreover, the controller in particular carries out the fault check of the individual subareas according to the determined order.

The implementation of the method in the form of software is also advantageous since this incurs particularly low costs, in particular when an executing control unit is also used for other tasks and is therefore present anyhow. Suitable data carriers for providing the computer program are in particular disks, hard disks, flash memories, EEPROMs, CD-ROMs, DVDs, among others. It is also possible to download a program via computer networks (Internet, Intranet, etc.).

Further advantages and embodiments of the present invention are derived from the description and the accompanying drawings.

It goes without saying that the above-mentioned features and those still to be described hereafter are usable not only in the particular described combination, but also in other combinations or alone, without departing from the scope of the present invention.

The present invention is shown schematically based on exemplary embodiments in the drawings and is described in greater detail hereafter with reference to the drawings.

DETAILED DESCRIPTION

Figure 1:
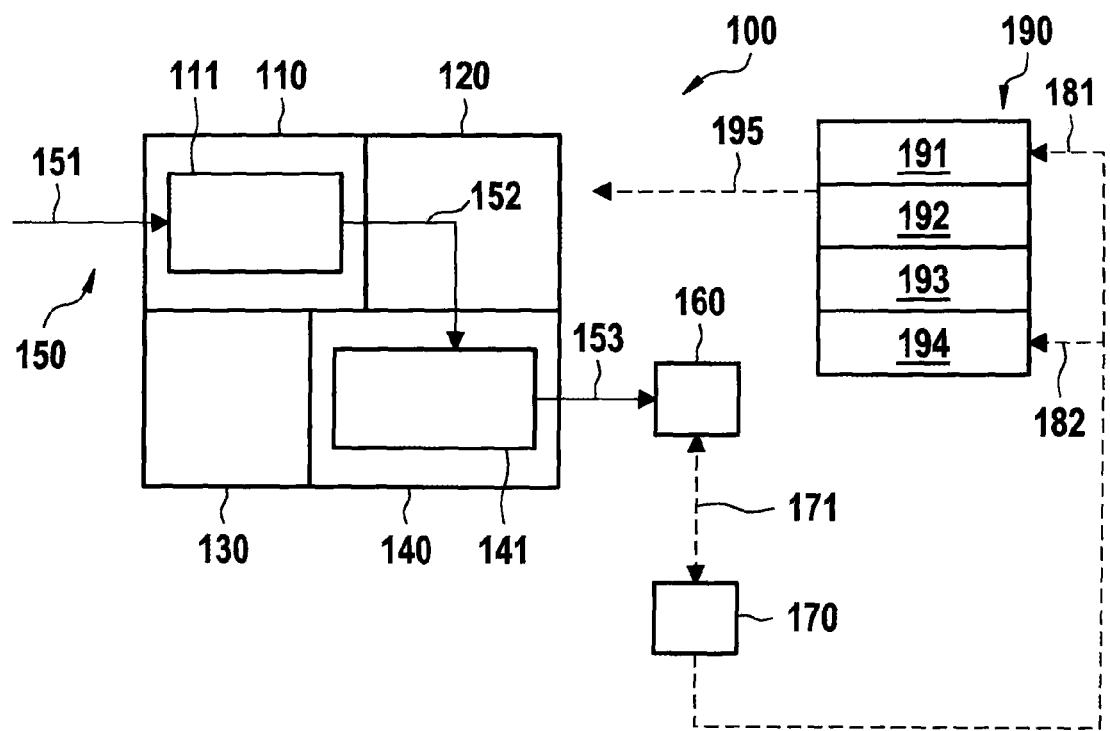
FIG. 1 shows a schematic illustration of a hardware-configurable logic circuit, which is configured to carry out a preferred embodiment of a method according to the present invention.

FIG. 1 shows a schematic illustration of a hardware-configurable logic circuit in the form of a field programmable gate array (FPGA) 100.

FPGA 100 is divided into four circuit areas 110, 120, 130, 140 by way of example. In these circuit areas 110, 120, 130, 140, a configuration of hardware elements or resources may be changed in each case according to the proviso of configuration data. It is thus also possible to change a function of individual circuit areas 110, 120, 130, 140.

FPGA 100 furthermore includes a configuration memory 190. The configuration memory is divided into four subareas 191, 192, 193, 194 by way of example. Configuration data, e.g., netlists, are stored in each of the four subareas 191, 192, 193, 194, and define the configuration of hardware elements or resources of the four circuit areas 110, 120, 130, 140 (indicated by reference numeral 195). Subarea 191 is linked to circuit area 110, for example, and contains netlists for this circuit area 110. Subarea 192 is linked to circuit area 120, for example, subarea 193 is linked to circuit area 130, for example, and subarea 194 is linked to circuit area 140, for example.

In the example shown in FIG. 1, hardware elements or resources 111 of circuit area 110 are specially configured. However, not all hardware elements or resources within circuit area 110 are used simultaneously. Only an advantageous portion of hardware elements or resources 111 of circuit area 110 is interconnected with each other according to a certain netlist of subarea 191. Analogously, hardware elements or resources 141 of circuit area 140 are specially configured and interconnected with each other according to a netlist of subarea 194.

Arrows 151, 152 and 153 indicate a data flow 150 through FPGA 100. An output signal 160 is generated with the aid of this data flow 150 and provided by FPGA 100. For this purpose, data are initially transmitted to circuit area 110 (indicated by reference numeral 151). Configured hardware elements 111 of circuit area 110 process these data. These processed data are forwarded from circuit area 110 to circuit area 140 (indicated by reference numeral 152). These data are in turn further processed by configured hardware elements 141 of circuit area 140. Circuit area 140 provides output signal 160 (indicated by reference numeral 153).

Thus, circuit areas 110 and 140 of FPGA 100 are involved in generating or providing output signal 160. Since circuit areas 110 and 140 were configured according to subareas 191 and 194 of configuration memory 190, these subareas 191 and 194 are involved in generating or providing output signal 160.

A controller 170 is configured to carry out a preferred embodiment of a method according to the present invention. Controller 170 monitors output signal 160 for this purpose, indicated by reference numeral 171. Controller 170 in particular monitors whether certain checking requirements are met. Such a checking requirement is in particular whether a signal level of output signal 160 changes or whether a level change of output signal 160 occurs. If this is the case, a fault check is triggered. Controller 170 now carries out a fault check of subareas 191 and 194 of configuration memory 190, which is involved in generating output signal 160. The fault check of subarea 191 is indicated by arrow 181; the fault check of subarea 140 is indicated by arrow 182.

Controller 170 thus checks whether output signal 160 is correct or faulty. Controller 170 furthermore checks whether the netlists according to which circuit areas 110 and 140 of FPGA 100 were configured are stored correctly or faultily in subareas 191 and 194 of configuration memory 190. Controller 170 carries out in particular an error correcting code (ECC) process of subareas 191 and 194 of configuration memory 190.

Figure 2:
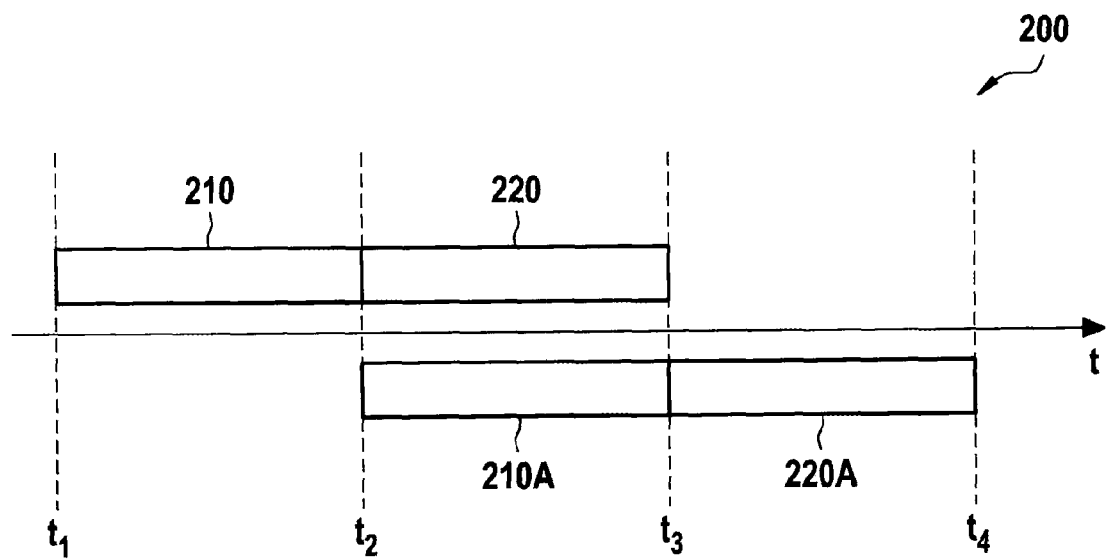
FIG. 2 shows a schematic illustration of a preferred embodiment of a method according to the present invention as a block diagram.

FIG. 2 shows a schematic illustration of a preferred embodiment of the method according to the present invention as a diagram 200.

The horizontal axis of diagram 200 is a time axis t. The blocks above time axis t symbolize subareas 210 and 220 of a configuration memory of an FPGA (analogous to FIG. 1) which process data for the provision of an output signal. Data are processed in a circuit area linked to subarea 210 between points in time $t_1$ and $t_2$. These data are subsequently further processed in a circuit area linked to subarea 220 between points in time $t_2$ and $t_3$.

In this example, a checking requirement is met at point in time $t_2$. A controller analogous to FIG. 1 thereupon carries out a fault check of subarea 210 between point in time $t_2$ and point in time $t_3$, indicated by block 210A.

The controller thereafter carries out a fault check of subarea 220 between points in time $t_3$ and $t_4$, indicated by block 220A.

Figure 3:
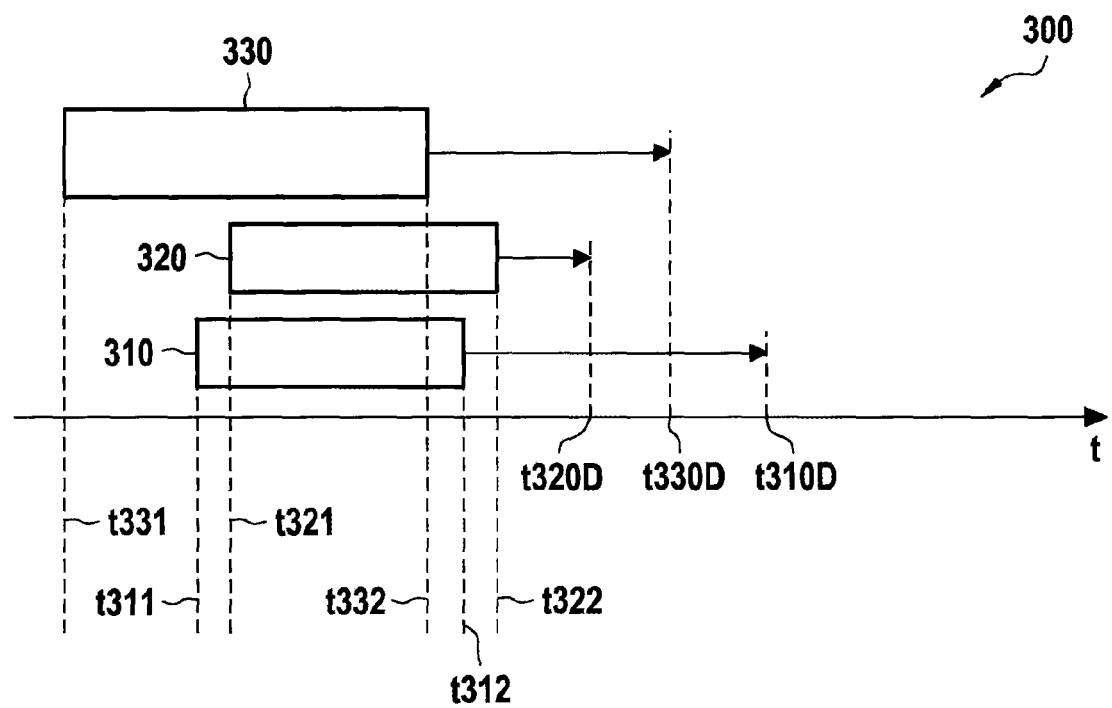
FIG. 3 shows a schematic illustration of a further preferred embodiment of a method according to the present invention as a block diagram.

FIG. 3 shows a schematic illustration of a further preferred embodiment of the method according to the present invention as a diagram 300, analogous to diagram 200 in FIG. 2.

FIG. 3 shows a fault check of an FPGA in which multiple output signals are generated in parallel and simultaneously. Different circuit areas simultaneously process data of different output signals. These different circuit areas are configured according to linked subareas 310, 320, 330 of a configuration memory.

For example, the circuit area linked to subarea 310 processes data of a first output signal between points in time t311 and t312. At point in time t312, a checking requirement is met and a fault check of subarea 310 is triggered.

The circuit area linked to subarea 320 processes data of a second output signal between points in time t321 and t322. At point in time t322, a further checking requirement is met and a fault check of subarea 320 is triggered.

The circuit area linked to subarea 330 processes data of a third output signal between points in time t331 and t332. At point in time t332, a further checking requirement is met and a fault check of subarea 330 is triggered.

Points in time t312, t322 and t332 at which fault checks of subareas 310, 320 and 330 are triggered are chronologically close to each other and occur approximately simultaneously. To now determine an order in which the fault check of individual subareas 310, 320 and 330 is carried out, the fault checks of subareas 310, 320 and 330 are prioritized. For this purpose, a deadline is assigned in each case to subareas 310, 320 and 330, by which the fault checks of the particular subarea 310, 320 and 330 must be completed.

Deadline t310D is assigned to subarea 310. Deadline t320D is assigned to subarea 320. Deadline t330D is assigned to subarea 330. The first deadline to lapse is deadline t320D of subarea 320. The second deadline to lapse is deadline t330D of subarea 330. The latest deadline t310D is assigned to subarea 310.

The order according to which subareas 310, 320 and 330 are checked for faults is thus determined according to deadlines t310D, t320D and t330D. The subarea having the shortest deadline, which is the next one to lapse, is the next one checked for faults. Initially, a fault check of subarea 320 is carried out, then of subarea 330 and then of subarea 310.

What is claimed is:

1. A method that is performed by a processing unit executing computer code stored in a non-transitory storage medium, the method being for checking for faults in a hardware-configurable logic circuit that includes circuit areas and a configuration memory having different subareas, a respective configuration of hardware elements of one of the circuit areas being defined by configuration data stored in an associated subarea of the configuration memory, the method comprising:
    when a result of at least one checking requirement that is performed on an output signal which is provided by the hardware-configurable logic circuit is met, carrying out a fault check of the configuration data only in those subareas of the configuration memory of the hardware-configurable logic circuit that are involved in generating the output signal.

2. The method as recited in claim 1, wherein the fault check is carried out using at least one of an error correcting code and a check sum.

3. The method as recited in claim 1, wherein the fault check includes checking whether the output signal was generated according to correct netlists, the netlists being stored in the respective subareas of the configuration memory which are to be checked.

4. The method as recited in claim 1, wherein the checking requirement is met when at least one of:
   a level change of the output signal occurs,
   a periodic requirement in regard to the output signal is met, and
   dependent level changes of the output signal and of a further signal occur.

5. The method as recited in claim 1, wherein the fault check of the configuration data in the subareas of the configuration memory of the hardware-configurable logic circuit which are involved in generating the output signal is carried out according to a certain order.

6. The method as recited in claim 5, wherein the order is determined one of during a regular operation of the hardware-configurable logic circuit and during a programming process of the hardware-configurable logic circuit.

7. The method as recited in claim 5, wherein a prioritization of the individual subareas of the configuration memory of the hardware-configurable logic circuit which are involved in generating the output signal is carried out for determining the order.

8. The method as recited in claim 5, wherein the order is determined as a function of deadlines of the individual subareas, the fault check of the individual subareas of the configuration memory of the hardware-configurable logic circuit which are involved in generating the output signal being carried out by the respective deadlines.

9. The method as recited in claim 1, wherein a field programmable gate array is used as the hardware-configurable logic circuit.

10. An arithmetic unit, which is configured to carry out a method corresponding to computer code stored in a non-transitory storage medium, the method being for checking for faults in a hardware-configurable logic circuit that includes circuit areas and a configuration memory having different subareas, a respective configuration of hardware elements of one of the circuit areas being defined by configuration data stored in an associated subarea of the configuration memory, the method comprising:
   when a result of at least one checking requirement that is performed on an output signal which is provided by the hardware-configurable logic circuit is met, carrying out a fault check of the configuration data only in those subareas of the configuration memory of the hardware-configurable logic circuit that are involved in generating the output signal.

11. A non-transitory computer program which prompts an arithmetic unit to carry out a method for checking for faults in a hardware-configurable logic circuit that includes circuit areas and a configuration memory having different subareas, a respective configuration of hardware elements of one of the circuit areas being defined by configuration data stored in an associated subarea of the configuration memory, the method comprising:
   when a result of at least one checking requirement that is performed on an output signal which is provided by the hardware-configurable logic circuit is met, carrying out a fault check of the configuration data only in those subareas of the configuration memory of the hardware-configurable logic circuit that are involved in generating the output signal.

12. A non-transitory machine-readable storage medium having a computer program stored thereon which prompts an arithmetic unit to carry out a method for checking for faults in a hardware-configurable logic circuit that includes circuit areas and a configuration memory having different subareas, a respective configuration of hardware elements of one of the circuit areas being defined by configuration data stored in an associated subarea of the configuration memory, the method comprising:
   when a result of at least one checking requirement that is performed on an output signal which is provided by the hardware-configurable logic circuit is met, carrying out a fault check of the configuration data only in those subareas of the configuration memory of the hardware-configurable logic circuit that are involved in generating the output signal.

* * * * *